(12) United States Patent
Rothleitner (10) Patent No.: US 6,878,996 B2
(45) Date of Patent: Apr. 12, 2005

(54) MOS POWER TRANSISTOR (75) Inventor: Hubert Rothleitner, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/447,649

(22) Filed: May 29, 2003

(65) Prior Publication Data

US 2004/0004263 A1 Jan. 8, 2004

(30) Foreign Application Priority Data

May 29, 2002 (DE) .......................... 102 23 950

(51) Int. Cl.⁷ .................. H01L 29/76; H01L 29/94
(52) U.S. Cl. .................. 257/341; 257/357; 257/371
(58) Field of Search .................. 257/341, 357, 257/365, 369, 371

(56) References Cited

U.S. PATENT DOCUMENTS

| | | | |
|---|---|---|---|
| 5,581,103 A | * 12/1996 | Mizukami | .................. 257/355 |
| 6,245,607 B1 | 6/2001 | Tang et al. | |
| 6,489,653 B2 | * 12/2002 | Watanabe et al. | ............ 257/343 |
| 6,747,318 B1 | * 6/2004 | Kapre et al. | ................. 257/368 |

* cited by examiner

Primary Examiner—Phat X. Cao
Assistant Examiner—Theresa T. Doan
(74) Attorney, Agent, or Firm—Laurence A. Greenberg; Werner H. Stemer; Gregory L. Mayback (57) ABSTRACT

An integrated MOS power transistors, in particular a lateral PMOS power transistor and a lateral n-DMOS power transistor, in which the bulk node is disposed in a manner spatially isolated from the source electrode zone. The particular integration structure of the MOS power transistor avoids a parasitic drain-bulk diode, a parasitic body diode and a substrate diode and thereby achieves an area-saving protection against over-currents in the event of reverse voltage polarity between drain and source.

12 Claims, 6 Drawing Sheets

MOS POWER TRANSISTOR

BACKGROUND OF THE INVENTION

Field of the Invention

The invention is concerned generally with MOS power transistors, and in particular with a PMOS power transistor which is particularly suitable for use as a high-side switch in vehicle electronics and with an n-DMOS power transistor which is particularly suitable for use as a low-side switch in vehicle electronics.

Figure 9:
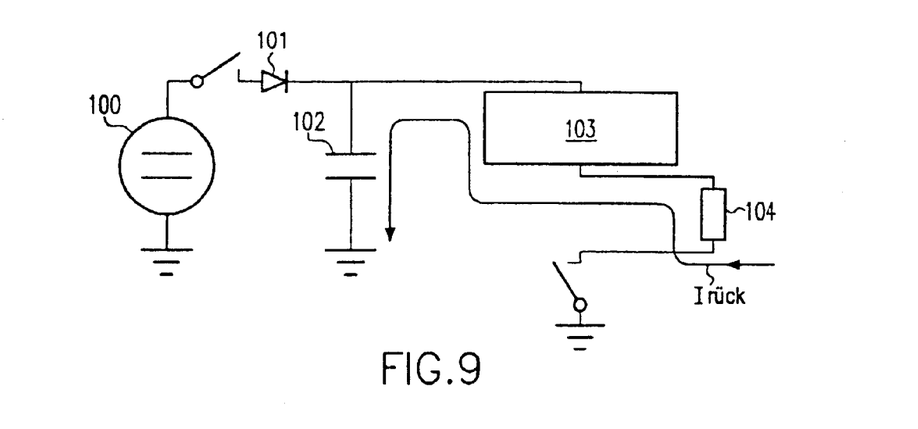
FIG. 9 is a block diagram of a high-side switching or regulating device, in which a high reverse current occurs in the case of a fault.

In vehicle electronics, it is necessary to protect peripheral high-side driver output lines of electronic control units (ECUs) from external disturbances. One type of this protection consists in protecting the high-side switch from high reverse currents that can flow from an output node of a line to a supply voltage node. This undesirable operating mode can occur if the output driver line is short-circuited toward a positive voltage source (e.g. 40 V) and there is simultaneously no feeding at the high-side driver. Such a situation is illustrated diagrammatically in the accompanying FIG. 9. FIG. 9 shows, in a simplified illustration, a supply voltage source 100, for example a battery, and a rectifier section which contains a rectifier element 101 and a storage capacitor 102 and feeds a high-side switching or regulating device 103. Under normal operating conditions, the high-side switching or regulating device 103 is supplied by the positive voltage source 100, which is connected in parallel with the storage capacitor 102. If a short-circuit to the supply voltage of the voltage source 100 then arises on the output driver line of a high-side transistor, then a reverse current $I_{reverse}$ flows away toward ground through a load 104, the high-side switching or regulating device 103 and the storage capacitor 102. This is the case if, for example, an electronic control unit (ECU) in a typical application in the vehicle is not supplied with voltage (switch s in FIG. 9 is open). Under FMEA consideration, a short-circuit to the positive supply voltage (for example to the battery voltage or an external voltage source having a high voltage) can be established.

Currently available high-side switches for such a high-side switching or regulating device 103 cannot solve this problem. Present-day high-side switches are realized using junction or "self isolation" technology in discrete or integrated switching devices. A plurality of switch types are available, most of which have the disadvantages mentioned in the above-described application in the vehicle. In the worst case, a reverse current can flow from the output line via the high-side switching or regulating device to a discharged storage capacitor and activate the load (ECU).

Typical high-side switches that are available nowadays have disadvantageous properties. N-DMOS switches permit a reverse current to flow through a parasitic diode from the bulk node to the drain electrode zone. A similar situation applies to PMOS power switches, in which a parasitic diode allows a reverse current from the drain electrode zone to the bulk node under the conditions outlined. NPN transistors used as high-side switches have the disadvantage that the emitter-base diode only withstands a reverse voltage of less than 10 V. This voltage is very low in order to satisfy the above-described requirement of blocking the reverse current. In addition, an NPN power transistor has a high power loss since its base current (Ib=Ic/beta) has to be fed from a driver stage.

A PNP transistor used as a high-side switch can meet the requirements set and thus block the reverse current. However, it must be taken into consideration that the driver power of PNP transistors in merged bipolar/CMOS technologies is very weak and that a high base current has to be generated by a driver stage. Therefore, there are only few practical applications of PNP transistors in such high-side stages.

Figure 10:
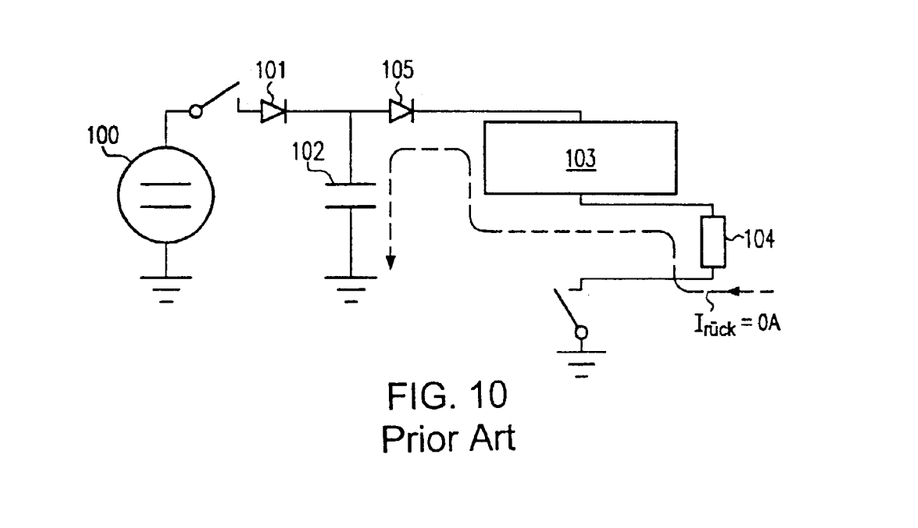
FIG. 10 is a block diagram of FIG. 9 with the use—proposed in the prior art—of a blocking diode which blocks the reverse current through the high-side switching or regulating device in the case of a fault.

The accompanying FIG. 10 shows a preventive measure—customary in vehicle high-side switching or regulating devices realized heretofore—for blocking the reverse current $I_{reverse}$ with a Schottky diode 105 connected in series with the supply voltage source 100. The aforementioned measure with the Schottky diode 105 can be used for N-MOS, P-MOS and NPN transistors in the high-side switching or regulating device 103. However, the disadvantage of this solution is that a voltage of 0.6 V, for example, is dropped across the Schottky diode 105.

Furthermore, a blocking diode can be integrated into the supply voltage circuit of the high-side switching or regulating device 103, which blocking diode also blocks the reverse current $I_{reverse}$ for NMOS, PMOS and NPN high-side switches. The disadvantage is the high resistance in the forward direction for the high-side switch and a parasitic PNP substrate current.

Furthermore, N-DMOS transistors connected in series with the drain electrode of an NMOS switching transistor have been proposed in the form of a so-called "back-to-back" solution. The additional N-DMOS transistor acts as a blocking diode against reverse current and reduces the voltage drop in normal switched-on operation. The disadvantage is that the area requirement of this, "back-to-back" solution is four times as large as the area requirement of an individual N-DMOS low-side driver, since the on resistance is inversely proportional to the area occupied by the N-DMOS transistor.

For this reason, a high-switching transistor is desired which can be integrated in a space-saving manner and can block the reverse current occurring in the case of a fault, that is to say in the case of a short circuit.

Figure 11:
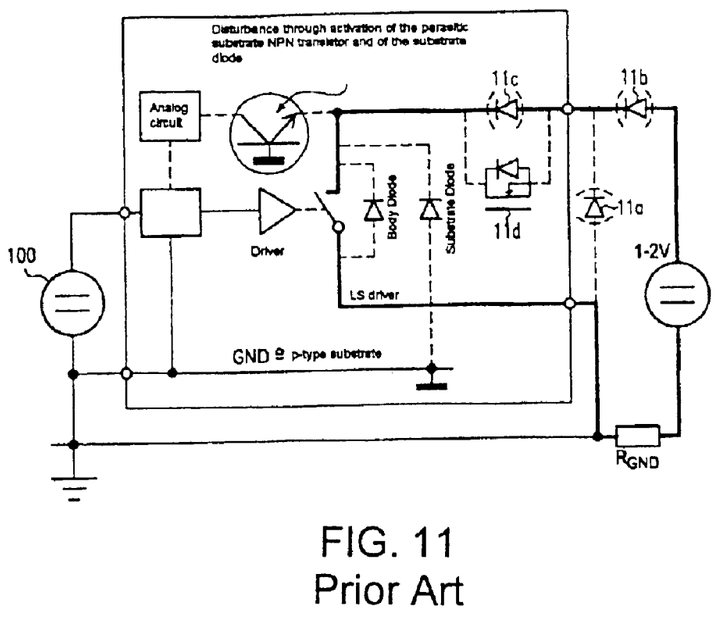
FIG. 11 is a circuit diagram of measures taken in the prior art for avoiding a negative drain-source voltage at a DMOS power transistor.

There are problems similar to those mentioned previously in low-side switching elements for vehicle electronics (see FIG. 11). In order to fill the wide application range, the low-side switching elements are realized using integrated silicon technology of high complexity. The low-side switches include CMOS transistor switches, bipolar transistors and power DMOS transistors. In the application mentioned by way of example, the DMOS transistors have the advantage that they have a low resistance in the activated state. The integrated silicon technology is usually realized on the basis of junction isolation technology with a p-conducting substrate. However, such DMOS transistors contain parasitic elements, as already mentioned.

Figure 7:
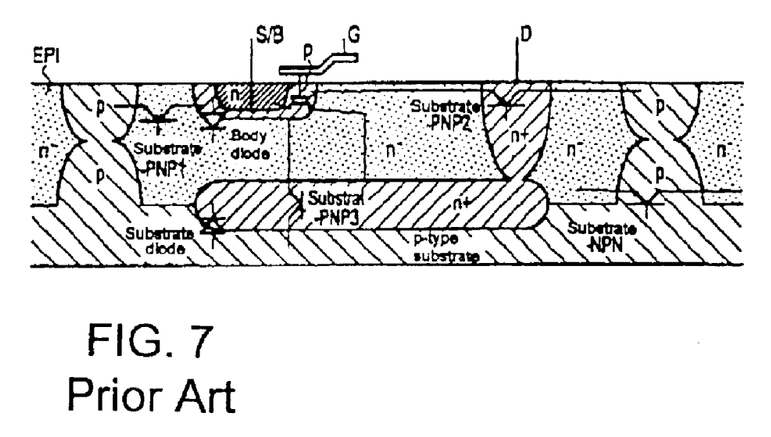
FIG. 7 is a diagrammatic, cross-sectional view of a DMOS power transistor structure with parasitic elements that is assigned to the prior art and has already been discussed.
Figure 8:
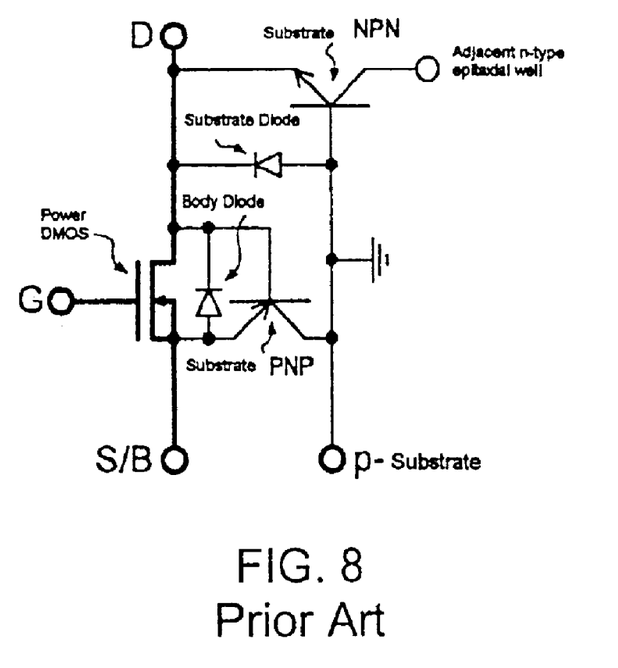
FIG. 8 is as an equivalent circuit diagram of the DMOS power transistor shown in FIG. 7 with the parasitic elements and according to the prior art.

In FIGS. 7 and 8, such a conventional DMOS power field-effect transistor is respectively illustrated in diagrammatic cross section and as an equivalent circuit diagram together with parasitic elements that are present in the conventional DMOS field-effect transistor. The elements include a parasitic NPN substrate transistor between a buried n$^+$-type layer serving as part of a drain electrode zone, a p-type substrate and an adjacent n-type epitaxial well. A parasitic PNP substrate transistor (substrate-PNP1) situated between the p-type well that insulates a source/bulk electrode S/B, the n-type epitaxial layer and the top section of the substrate. A substrate PNP transistor (substrate-PNP2) between the p-type well that insulates the source/bulk electrode S/B, the top section of the drain electrode and the top section of the p-type substrate. A body diode in parallel with the DMOS power transistor between the p-type well and the n-type epitaxial layer, and a substrate diode between the p-type substrate and the buried n+-type layer of the drain electrode.

In FIG. 7, there is yet another parasitic PNP transistor (substrate-PNP3) contained between the p-type well that insulates the S/B electrode, the n+-conducting buried layer and the p-type substrate.

If a negative drain-source voltage (e.g. −1 V) is present at such a DMOS power transistor (in the case of a fault), two main effects are established (also see FIG. 11). First, the body diode is biased in the forward direction, and a high current flows from the source electrode to the peripheral line (drain electrode) and also through the p-type substrate through the parasitic substrate PNP transistors. Second, the substrate diode is biased in the forward direction, and a high current flows from the p-type substrate to the peripheral line (drain electrode) and also through the parasitic substrate NPN transistor from circuit elements in an adjacent n-type epitaxial well. The activation of the parasitic substrate NPN transistor can lead to functional disturbances or to the failure of circuit parts that are jointly integrated with the DMOS transistor.

The following measures have been taken heretofore in order to avoid the above-described first and second problems (FIG. 11). An external Schottky-diode 11a has been connected in parallel with the source electrode and drain electrode, which has limited the current through the integrated silicon DMOS transistor structure. However, this has lead to a high peripheral reverse current flowing through the Schottky diode. A blocking diode 11b has been connected in series with the drain electrode. The disadvantage is the high forward resistance. A blocking diode 11c has been integrated in series with the drain electrode. In this case, too, the forward resistance is high and, moreover, a parasitic PNP substrate current is established. An additional DMOS transistor 11d has been integrated in series with the drain electrode in the form of a so-called "back-to-back" structure.

The additional DMOS transistor acts as a blocking diode in the case of a negative peripheral voltage and reduces the voltage drop in the event of normal switch-on of the DMOS transistor. This solution has already been mentioned above in connection with the high-side DMOS switch. The disadvantage mentioned there, namely of the increased area requirement in comparison with an individual DMOS transistor solution, applies in this case as well.

After the above statements, a DMOS power transistor for low-side applications is also desirable which can avoid the parasitic driver currents that flow in the case of an output voltage of negative polarity by the elimination of the parasitic elements: "body diode" and "substrate diode".

SUMMARY OF THE INVENTION

It is accordingly an object of the invention to provide a MOS power transistor that overcomes the above-mentioned disadvantages of the prior art devices of this general type, which can avoid parasitic elements that cause a high reverse current in the case of the polarity reversal at its output and thereby effectively block the undesirable reverse current that has flowed in such faulty operation heretofore in the prior art. Furthermore, the intention is for such a MOS power transistor to be integrable in an area-saving manner.

With the foregoing and other objects in view there is provided, in accordance with the invention, an integrated MOS power transistor. The MOS power transistor contains a p-conducting substrate region, an n-conducting semiconductor region disposed in the p-conducting substrate region, at least one source electrode zone of a first conductivity type disposed in the n-conducting semiconductor region, at least one drain electrode zone of the first conductivity type disposed in the n-conducting semiconductor region, at least one gate electrode zone of a second conductivity type, and at least one doped bulk node of the second conductivity type disposed in a manner isolated from the source electrode zone. The gate electrode zone, the drain electrode zone, the gate electrode zone and the doped bulk node are formed in a lateral direction such that the gate electrode zone lies between the source electrode zone and the drain electrode zone or the doped bulk node.

In accordance with an essential aspect, the integrated MOS power transistor, has, in the n-conducting semiconductor region disposed in the p-conducting substrate region, at least one source electrode zone of a first conductivity type, at least one drain electrode zone of the first conductivity type, at least one gate electrode zone of a second conductivity type and at least one highly doped bulk node of the second conductivity type formed in a lateral direction in such a way that each gate electrode zone lies between in each case a source electrode zone and an adjacent drain electrode zone or an adjacent bulk node. The MOS power transistor is characterized in that each bulk node is disposed in a manner isolated from the source electrode zone or zones.

Consequently, the essential difference from the conventional solution, be it a high-side PMOS transistor or a low-side N-DMOS transistor, is the isolation of the bulk node or the bulk electrode from the source electrode. With this step that is essential to the invention, the parasitic diode from the drain electrode to the bulk node that is present in the conventional PMOS power transistors and, in an N-DMOS power transistor, the parasitic diode from the bulk node to the drainage electrode (the body diode) is avoided and any reverse current is thereby prevented.

The MOS power transistor solution proposed according to the invention is embodied in the form of a PMOS power transistor for high-side applications and as an N-DMOS power transistor for low-side applications.

A PMOS power transistor is preferably realized as a lateral high-voltage transistor with an integrated source bulk switch that has high breakdown strength with respect to voltages of reverse polarity. Finally, in an advantageous embodiment, the source bulk switch is integrated together with the PMOS power transistor, and a space-saving solution is thereby achieved.

The N-DMOS power transistor configured for the low-side application can also be realized in a space-saving manner since the additional low-voltage NMOS transistor can be integrated with the N-DMOS power transistor. The source contacts and bulk contacts of the N-DMOS power transistor proposed can also be realized in a space-saving manner.

In order to provide a better understanding, the above-described and further advantageous features of the invention are described in more detail in exemplary embodiments with reference to the drawing.

In accordance with an added feature of the invention, the source electrode zone and the drain electrode zone both of the first conductivity type are p-conducting. The gate electrode zone and the doped bulk zone both of the second conductivity type are n-conducting. The source electrode zone, the drain electrode zone, the gate electrode zone, and the doped bulk zone define a PMOS transistor.

In accordance with an additional feature of the invention, the n-conducting semiconductor region is an n⁻-type epitaxial region.

In accordance with another feature of the invention, a buried n⁺-type layer is provided and lies below the n⁻-type epitaxial region. The doped bulk node is disposed in a form of a deep n⁺-type sinker in the n⁻-type epitaxial region at a periphery of the PMOS power transistor and is connected to the buried n⁺-type layer. The deep n⁺-type sinker forms an n⁻-type well with the buried n⁺-type layer. A PMOS source-bulk switching transistor is provided and is driven separately from the PMOS transistor and has a control gate. The PMOS source-bulk switching transistor is integrated between the doped bulk node and the source electrode zone in the n⁻-type epitaxial region.

In accordance with a further feature of the invention, a switch-on means is connected to the control gate of the PMOS source-bulk switching transistor. During normal operation of the PMOS transistor where the PMOS transistor has a source-drain voltage higher than a voltage at the doped bulk node, the switch-on means applies a gate voltage being less than the voltage at the doped bulk node to the control gate of the PMOS source-bulk switching transistor. A switch-off means is connected to and switches off the PMOS source-bulk switching transistor. The switch-off means switches off the PMOS source-bulk switching transistor in a reverse operation of the PMOS transistor, when the source-drain voltage of the PMOS transistor is lower than the voltage at the doped bulk node.

In accordance with a further added feature of the invention, the PMOS source-bulk switching transistor has a breakdown voltage being higher than the source-drain voltage of the PMOS transistor.

In accordance with a further additional feature of the invention, the switch-on means and the switch-off means for the PMOS source-bulk switching transistor lie within or outside the n⁻-type epitaxial region of the PMOS transistor.

In accordance with another further feature of the invention, the source electrode zone and the drain electrode zone both of the first conductivity type are n-conducting. The gate electrode zone and the doped bulk zone both of the second conductivity type are p-conducting. The source electrode zone, the drain electrode zone, the gate electrode zone, and the doped bulk zone define an n-DMOS transistor.

In accordance with a another added feature of the invention, the n⁻conducting semiconductor region is an n⁻-type epitaxial region. The n⁻-type epitxial region has an n-type well and the drain electrode zone lies in the n-type well. The n⁻-type epitaxial region has a p-type body zone and the source electrode zone lies in the p-type body zone. The p-conducting substrate region has a double well structure formed therein.

The double well structure is formed of an outer n⁺-type well and an inner p-type well. The n⁻-type epitaxial region encompassing the n-DMOS transistor lies in the double well structure. The inner p-type well is conductively connected to the p-type body zone and the doped bulk node. The outer n⁺-type well is connected to the source electrode zone.

In accordance with another additional feature of the invention a resistor is provided. The source electrode zone is connected to the doped bulk node and to the p-type body zone by the resistor. The resistor is integrated in the n-DMOS transistor. Alternatively, the resistor is connected off-chip to the n-DMOS transistor.

In accordance with another feature of the invention, an NMOS transistor is provided. The source electrode zone, under normal operating conditions of the n-DMOS transistor, is connected to the doped bulk node and to the p-type body zone by the NMOS transistor integrated outside the inner p-type well.

In accordance with a concomitant feature of the invention, the doped bulk node is a p⁺⁺type bulk node. The NMOS transistor has an n-type source zone and an n-type bulk zone connected to the p⁺⁺type bulk node within the n⁻-type epitaxial region. The NMOS transistor has a drain zone connected to the drain electrode zone of the n-DMOS transistor, outside of the n⁻-type epitaxial region. The NMOS transistor has a gate electrode connected to the gate electrode zone of the n-DMOS transistor outside of the n⁻type epitaxial region.

Other features which are considered as characteristic for the invention are set forth in the appended claims.

Although the invention is illustrated and described herein as embodied in a MOS power transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
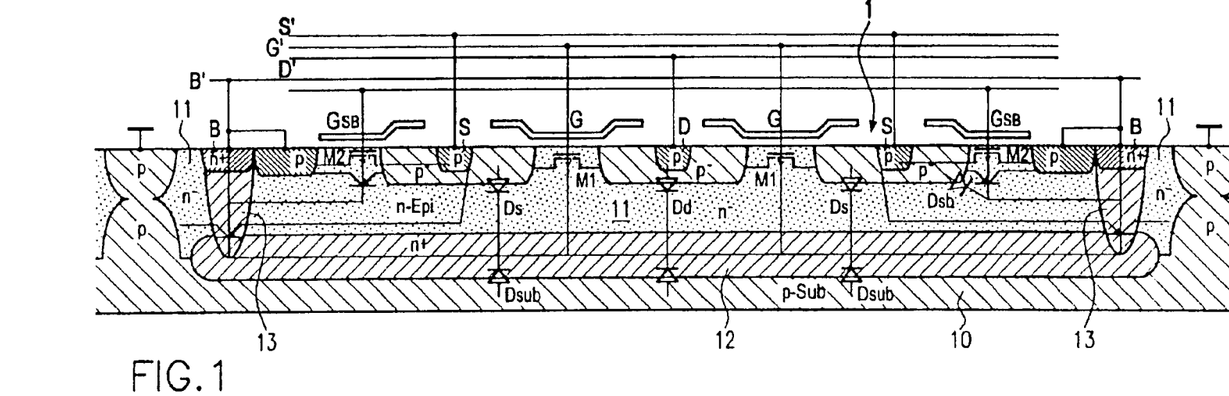
FIG. 1 is a diagrammatic, cross-sectional view through an exemplary embodiment of a lateral PMOS transistor according to the invention together with parasitic elements.

Referring now to the figures of the drawing in detail and first, particularly, to FIG. 1 and thereof, there is shown a first exemplary embodiment according to the invention of a lateral PMOS power transistor suitable for high-side applications, which exemplary embodiment is generally designated by the numeral 1. The cross section in FIG. 1 shows that the PMOS power transistor 1 according to the invention is integrated within an n⁻-type well in a p-type substrate 10 (p-sub). The n⁻-type well, shown hatched, contains a buried n⁺-type layer 12 and deep n⁺-type sinkers 13, which peripherally enclose the lateral PMOS structure. A PMOS transistor structure M1 is situated in an n⁻-type epitaxial layer 11 formed above the buried n⁺-type layer 12.

Figure 2:
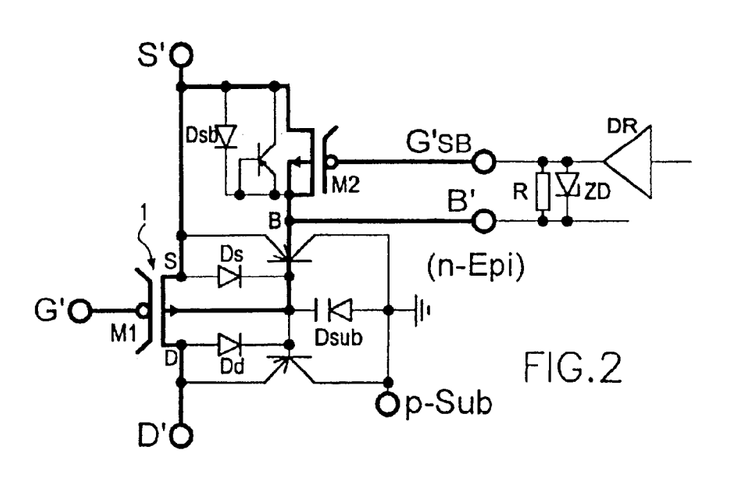
FIG. 2 is an equivalent circuit diagram of the PMOS power transistor shown in cross section in FIG. 1 together with parasitic elements.

The main difference between the lateral PMOS power transistor structure according to the invention and conventional PMOS power transistors is the isolation of a bulk node B, which is formed in an upper section of the deep sinkers 13, from source electrode zones S. This measure eliminates the parasitic diode that is present in the prior art from a drain electrode zone to the bulk node. In order to increase the power of the lateral PMOS transistor according to the invention, a plurality of source electrode zones S, drain electrode zones D and gate zones G are usually formed in a lateral direction, so that in reality a plurality of PMOS transistors M1 in parallel are produced. The p-conducting drain and source electrode zones D and S are each situated in p⁻-type wells within the n-type epitaxial layer 11. The other essential difference of the PMOS power transistor according to the invention that is illustrated in FIGS. 1 and 2 is an increase in the breakdown voltage between the bulk node B and the source electrode zone S, since operation with reverse voltage polarity transfers the output voltage at the bulk node B to the bulk of the transistor. Therefore, according to the invention, the breakdown voltage between the bulk node B and the source electrode zone S is increased by a deep staggered P/N junction and the correct choice of the configuration of the polysilicon gate/field plate G.

Drain and source electrode terminals may be embodied in the form of parallel alternate strips.

Under normal operating conditions, in which the voltage at the external source terminal S' is higher than the voltage at the external drain terminal D', an additionally integrated switching transistor M2 between the respective bulk node B and the respectively adjacent source electrode zone S is switched on by a suitable voltage fed to a gate electrode $G_{SB}$ of the additional switching transistor M2. In FIG. 1, the additional switching transistor M2 is integrated into the PMOS power transistor structure by a p-type zone connected to the bulk node B being indiffused beside the bulk node B. The additional p-type zone is situated opposite the adjacent source electrode zone S. A gate driver DR for the additional transistor M2 must be able to provide, at the gate terminal $G_{SB}$ of the transistor M2, a voltage that is about 5 V less than the bulk voltage at the bulk node B. The voltage between the gate $G_{SB}$ of the transistor M2 and the bulk node B can be clamped by a suitable zener diode ZD or any other voltage clamping device. The zener diode ZD is required in order to avoid a breakdown of the gate oxide of the additional transistor M2 due to an over-voltage. The zener diode ZD is illustrated in FIG. 2, but not in the cross section in FIG. 1.

In the case of a potential reversal, if the voltage at the source terminal S' is less than the voltage at the drain terminal D', the voltage at the terminal B' and thus at the bulk node B becomes greater than the voltage at the source terminal S'. The additional PMOS transistor M2 then switches off. The breakdown voltage of the PMOS transistors M2 is greater than the voltage of the bulk node B. The switch-off of the additional PMOS transistor M2 can be realized by a resistor R connected between the gate terminal $G_{SB}$ of the additional transistor M2 and the bulk terminal B'. The resistor R is not illustrated in FIG. 1, but is illustrated in FIG. 2. Any other driver configuration for the gate terminal $G_{SB}$ of the additional PMOS transistor M2 that satisfies the other function can be used instead.

In accordance with FIGS. 1 and 2, the lateral MOS power transistor 1 according to the invention has, as parasitic elements, a substrate diode $D_{sub}$ between the p-type substrate 10 and the buried n⁺-type layer 12, a source diode $D_s$ between the source electrode zone S and the buried n⁺-type layer 12, a drain diode $D_d$ between the drain electrode zone D and the buried n⁺-type layer 12 (the source diode $D_s$ and the drain diode $D_d$ are each connected anti-parallel with respect to the substrate diode $D_{sub}$), a parasitic PNP transistor in each case between the p-type substrate and the drain electrode zone and the p-type substrate and the source electrode zone (only depicted in FIG. 2), a PNP transistor connected in parallel with the additional PMOS transistor M2, and also a parasitic diode $D_{sb}$ between the source electrode zone S and the bulk node B (the deep sinkers 13). However, the above-mentioned parasitic elements do not obstruct the desired blocking function of the PMOS power transistor 1 according to the invention against reverse currents in the event of reverse polarity at its output.

The above-described exemplary embodiment 1 of the PMOS power transistor M1 according to the invention as illustrated in FIGS. 1 and 2 is a lateral PMOS transistor in which the bulk node B is isolated from the source electrode zones S. The breakdown voltage between the bulk node B and the source electrode zone S is increased by the deep staggered P/N junction and the suitable choice of the configuration of the polysilicon gate field plate. The additional source bulk switching transistor M2 is integrated into the lateral PMOS transistor structure 1. The PMOS power transistor M1 has no parasitic body diode conducting in the reverse direction, but instead increased breakdown voltage strength in the event of potential reversal at the output. The described structure of the PMOS power transistor M1 affords a space-saving solution for avoiding reverse current in the event of potential reversal in high-side switch or regulator configurations and is therefore particularly suitable for such high-side applications in vehicles.

Figure 3:
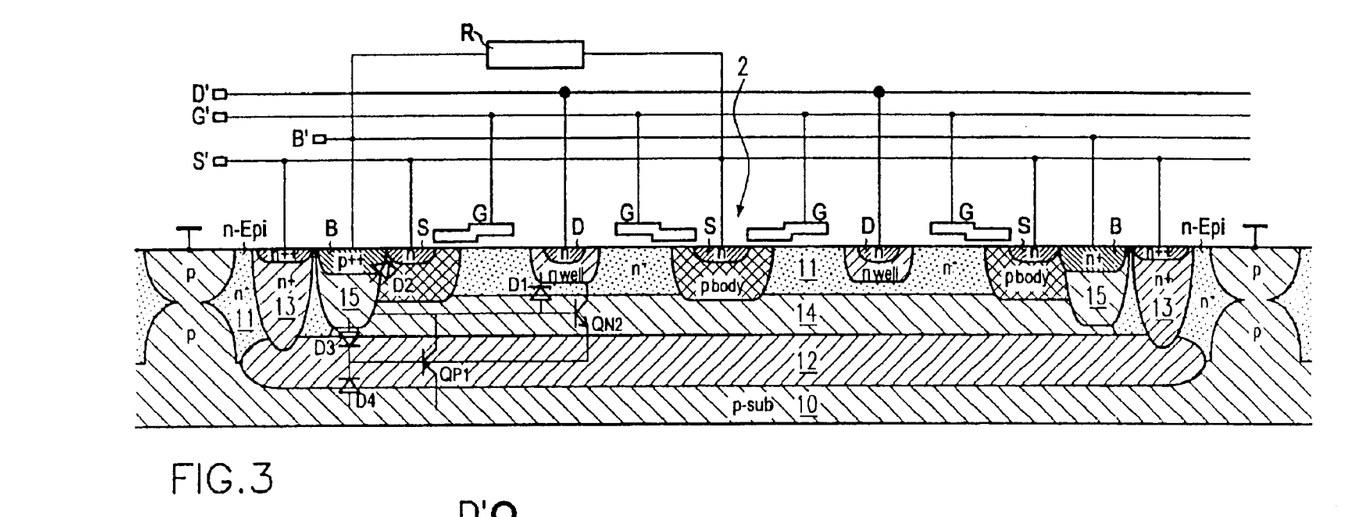
FIG. 3 is a diagrammatic, cross-sectional view through a first exemplary embodiment of a lateral N-DMOS transistor according to the invention with parasitic elements and an additional resistor R realized externally, i.e. outside the N-DMOS transistor structure.
Figure 4:
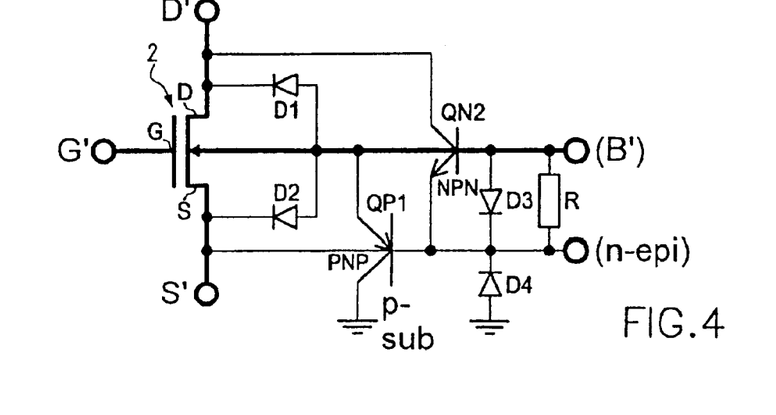
FIG. 4 is an equivalent circuit diagram of the N-DMOS transistor shown in FIG. 3 together with parasitic elements.

A first exemplary embodiment of an N-DMOS power transistor according to the invention with its parasitic elements, which exemplary embodiment is generally designated by the numeral 2, is respectively illustrated in cross section and as an equivalent circuit diagram in FIGS. 3 and 4.

In this case, too, the bulk node B is integrated in a manner isolated from the source electrode zone S, but is externally connected by the additional resistor R, the function and realization of which are described further below. The N-DMOS power transistor 2 (DMOS=double diffused metal oxide semiconductor) illustrated in cross section in FIG. 3 is realized in a double well structure. The double well structure contains a first well, having a buried n⁺-type layer 12 and a peripheral n⁺-type sinker 13, and also a second p-type well, which is formed within the first well 12, 13 and contains a buried p-type layer 14 and a p-type ring 15 peripherally surrounding the latter. In the case of the p-type well, the p-type diffusions may in each case be the same as those provided for the upper and lower p-type insulation zones of the p-type substrate 10. The buried p-type layer 14 is connected to the bulk node B of the transistor 2. The n-type drain electrode zones D are situated in low n-type wells within the n-type epitaxial layer 11, while the n-conducting source electrode zones S are situated in a respective p-type body zone, which extend downward as far as the buried p-type layer 14 and are connected to the latter there. The $n^+$-type well 12, 13 is connected to the source electrode zones S externally, i.e. outside the integration region of the N-DMOS transistor 2. A comparison of FIG. 3 with the N-DMOS structure associated with the prior art, described in the introduction, with reference to FIGS. 7 and 8, shows that the N-DMOS transistor according to the invention has a lateral structure since the buried $n^+$-type layer (FIG. 7) is no longer available as the drain electrode.

Under normal operating conditions, the source electrode and bulk node (body) have to be connected to one another in order to define a defined threshold voltage, to prevent additional drain current through parasitic elements, and to achieve a defined high breakdown voltage by avoiding an open base of the DMOS body NPN transistor.

In the first alternative illustrated in FIGS. 3 and 4, in the N-DMOS transistor 2 according to the invention, the source electrode and bulk node are connected simply by the additional resistor R, for example by a polysilicon path. The value of the resistor R should be small enough to avoid excessively high current peaks at drain voltage transitions (dV/dt). The application of a negative drain voltage produces a negative drain current that is clamped by the additional resistor R and whose intensity is determined by the value of the resistor R. Although this is not illustrated in FIG. 3, the resistor is normally integrated in the form of a polysilicon path. Instead of this, it may also be realized externally, for example on a printed circuit board.

In accordance with FIGS. 3 and 4, parasitic elements of the N-DMOS transistor 2 are a PNP transistor QP1 from the bulk node B to the p-type substrate 10, an NPN transistor QN2 from the drain electrode zone D to the buried $n^+$-type layer 12 and thus to the bulk node B, a parasitic diode D1 between the bulk node B and the drain electrode zone D, a parasitic diode D2 between the bulk node B and the source electrode zone S, a diode D3 from the bulk node B to the source electrode zone S and a diode D4 from the p-type substrate 10 to the source electrode zone S.

Figure 5:
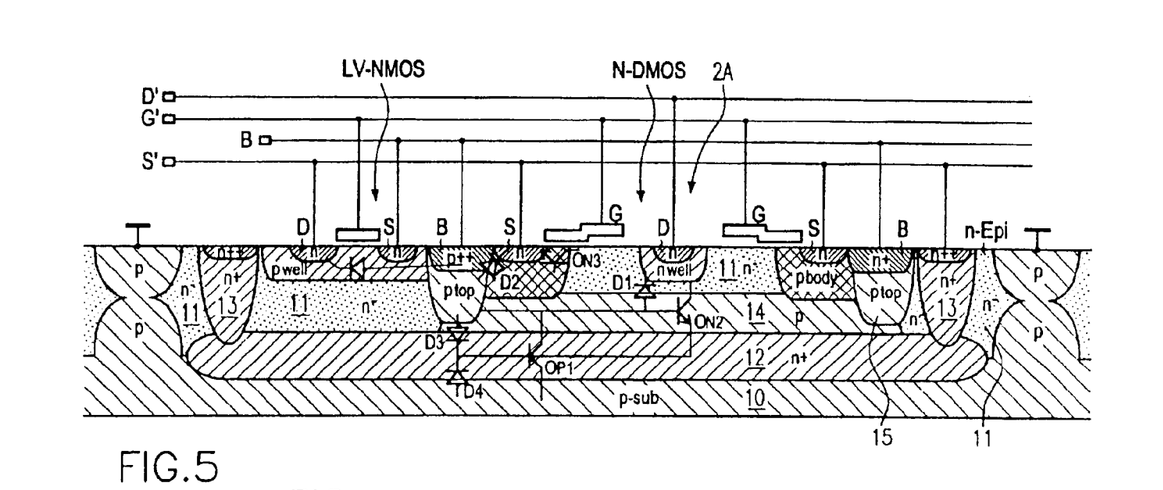
FIG. 5 is a diagrammatic, cross-sectional view through an alternative exemplary embodiment of the lateral N-DMOS transistor according to the invention with an additional N-MOS low-voltage transistor, which is integrated outside the N-DMOS transistor structure but together with the latter, and with parasitic elements.
Figure 6:
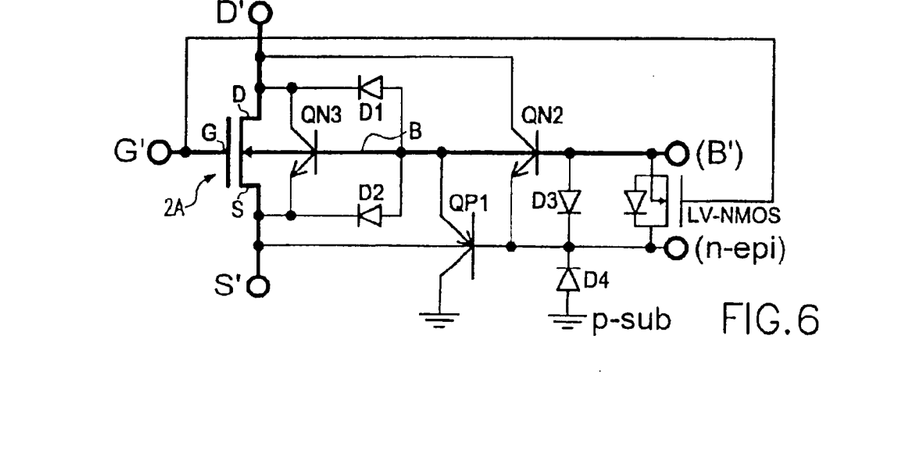
FIG. 6 is an equivalent circuit diagram of the alternative embodiment of the N-DMOS transistor shown in FIG. 5 with the parasitic elements.

FIGS. 5 and 6 respectively show in cross section a second (alternative) embodiment of a lateral N-DMOS power transistor 2A according to the invention. The N-DMOS structure 2A is embodied essentially identically to the first alternative shown in FIGS. 3 and 4. However, in accordance with FIGS. 5 and 6, the second alternative has, instead of the low-value resistor R connecting the bulk node B to the source electrode zone S, a low-voltage NMOS transistor LV-NMOS integrated outside the N-DMOS structure. The body (bulk node) B of the N-DMOS transistor is connected to the source electrode/the bulk node of the low-voltage NMOS transistor LV-NMOS and the source electrode zone of the N-DMOS transistor is connected to the drain electrode of the low-voltage NMOS transistor LV-NMOS and the two gate electrodes are connected to one another. Under normal operating conditions (N-DMOS transistor switches on), the low-voltage NMOS transistor LV-NMOS operates in the third quadrant of its output characteristic curve. If the potential at the N-DMOS drain electrode D falls below ground potential (N-DMOS transistor must be switched off at a negative drain voltage), the low-voltage NMOS transistor LV-NMOS switches off. In this case, the minimum drain voltage of the N-DMOS transistor 2A is determined from the breakdown voltage sent between the drain and source of the low-voltage NMOS transistor LV-NMOS. In many applications, the minimum static drain voltage of the N-DMOS transistor 2A is approximately −1 V to −2 V, so that the breakdown voltage between the drain and source of the low-voltage NMOS transistor LV-NMOS can easily be established. The low-voltage NMOS transistor LV-NMOS may be integrated within the external well 12, 13, containing the buried $n^+$-type layer 12 and the deep $n^+$-type sinkers 13, in the manner shown in FIG. 5. Instead of this, it is also possible to choose an insulated n-type well for the additional low-voltage NMOS transistor LV-NMOS and also an off-chip solution.

In accordance with FIGS. 4 and 6, the parasitic diode D2 is connected in parallel with the resistor R of the N-DMOS transistor 2 in accordance with the first alternative and in parallel with the additional low-voltage NMOS transistor LV-NMOS of the second alternative. The breakdown voltage of the parasitic diode can be set technologically by the choice of the correct p-type and n-type concentrations for the body (B) and the source electrode zone of the DMOS transistor 2 or 2A and also by the appropriate lateral spacing for the contact implantations. The breakdown voltage of the diode D2 must be lower than that of the low-voltage NMOS transistor LV-NMOS in order to protect the latter when over-voltage spikes occur.

The N-DMOS transistor 2, 2A according to the invention, as described above with reference to FIGS. 3 to 6, is implemented as a lateral N-DMOS transistor in a double well structure; and its source electrode region is isolated from its bulk node.

An additional resistor R or an additional low-voltage NMOS transistor LV-NMOS connect the bulk node to the source electrode in accordance with the first and second alternatives. The gate electrode of the additional low-voltage NMOS transistor is connected to the gate electrode of the power N-DMOS transistor 2A. The lateral N-DMOS transistor has no parasitic drain/p-type substrate diode and no reverse-biased body diode; and the invention affords an area-saving solution in order to avoid excessively high currents in the events of DMOS drain voltages of reverse polarity, and, moreover, an area-saving solution for the source and bulk contacts of the N-DMOS transistor.

With these advantageous features, the above-described N-DMOS transistor 2, 2A according to the invention is particularly suitable as a power transistor in low-side applications in vehicle electronics.

I claim:

1. An integrated MOS power transistor, comprising:

a p-conducting substrate region;

an n-conducting semiconductor region disposed in said p-conducting substrate region;

at least one p-conducting source electrode zone disposed in said n-conducting semiconductor region;

at least one p-conducting drain electrode zone disposed in said n-conducting semiconductor region;

at least one n-conducting gate electrode zone;

at least one p-conducting doped bulk zone disposed in a manner isolated from said source electrode zone;

said source electrode zone, said drain electrode zone, said gate electrode zone and said doped bulk zone formed in a lateral direction such that said gate electrode zone lies between said source electrode zone and one of said drain electrode zone and said doped bulk zone;

said source electrode zone, said drain electrode zone, said gate electrode zone, and said doped bulk zone define a PMOS transistor;

a PMOS source-bulk switching transistor being driven separately from said PMOS transistor and having a control gate, said PMOS source-bulk switching transistor is integrated between said doped bulk zone and said source electrode zone in said n-conducting semiconductor region;

switch-on means connected to said control gate of said PMOS source-bulk switching transistor, during normal operation of said PMOS transistor where said PMOS transistor having a source-drain voltage higher than a voltage at said doped bulk zone, said switch-on means applying a gate voltage being less than the voltage at said doped bulk zone to said control gate of said PMOS source-bulk switching transistor; and switch-off means connected to and switching off said PMOS source-bulk switching transistor, said switch-off means switches off said PMOS source-bulk switching transistor in a reverse operation of said PMOS transistor, when the source-drain voltage of said PMOS transistor being lower than the voltage at said doped bulk zone.

2. The MOS power transistor according to claim 1, wherein said n-conducting semiconductor region is an n-type epitaxial region.

3. The MOS power transistor according to claim 2, further comprising:

a buried n-type layer lying below said n-type epitaxial region, said doped bulk zone is disposed in a form of a deep n-type sinker in said n-type epitaxial region at a periphery of the PMOS power transistor and is connected to said buried n-type layer, said deep n-type sinker forms an n-type well with said buried n-type layer.

4. The MOS power transistor according to claim 2, wherein said switch-on means and said switch-off means for said PMOS source-bulk switching transistor lie one of within and outside said n-type epitaxial region of said PMOS transistor.

5. The MOS power transistor according to claim 1, wherein said PMOS source-bulk switching transistor has a breakdown voltage being higher than the source-drain voltage of said PMOS transistor.

6. An integrated MOS power transistor, comprising:

a p-conducting substrate region;

an n-conducting semiconductor region disposed in said p-conducting substrate region and having a p-type body zone;

at least one n-conducting source electrode zone disposed in said n-conducting semiconductor region;

at least one n-conducting drain electrode zone disposed in said n-conducting semiconductor region;

at least one p-conducting gate electrode zone;

at least one p-conducting doped bulk zone disposed in a manner isolated from said source electrode zone;

said source electrode zone, said drain electrode zone, said gate electrode zone and said doped bulk zone formed in a lateral direction such that said gate electrode zone lies between said source electrode zone and one of said drain electrode zone and said doped bulk zone;

said source electrode zone, said drain electrode zone, said gate electrode zone, and said doped bulk zone define a n-DMOS transistor; and said p-conducting substrate region having a double well structure formed therein, said double well structure formed of an outer n-type well and an inner p-type well, said n-conducting semiconductor region encompassing said n-DMOS transistor lying in said double well structure, said inner p-type well being conductively connected to said p-type body zone and said doped bulk zone, said outer n-type well being connected to said source electrode zone.

7. The MOS power transistor according to claim 6, wherein said n-conducting semiconductor region is an n-type epitaxial region;

said n-type epitxial region has an n-type well and said drain electrode zone lies in said n-type well; and said n-type epitaxial region has said p-type body zone and said source electrode zone lies in said p-type body zone.

8. The MOS power transistor according to claim 7, further comprising a resistor, and said source electrode zone is connected to said doped bulk zone and to said p-type body zone by said resistor.

9. The MOS power transistor according to claim 8, wherein said resistor is integrated in said n-DMOS transistor.

10. The MOS power transistor according to claim 8, wherein said resistor is connected off-chip to said n-DMOS transistor.

11. The MOS power transistor according to claim 7, further comprising an NMOS transistor, said source electrode zone, under normal operating conditions of said n-DMOS transistor, is connected to said doped bulk zone and to said p-type body zone by said NMOS transistor integrated outside said inner p-type well.

12. The MOS power transistor according to claim 11, wherein:

said doped bulk zone is a $p^{++}$type bulk zone;

said NMOS transistor having an n-type source zone and an n-type bulk zone connected to said $p^{++}$type bulk zone within said n-type epitaxial region;

said NMOS transistor having a drain zone connected to said drain electrode zone of said n-DMOS transistor, outside of said n-type epitaxial region; and said NMOS transistor having a gate electrode connected to said gate electrode zone of said n-DMOS transistor outside of said n-type epitaxial region.

* * * * *